United States Patent
Teraoka et al.

(10) Patent No.: US 9,756,769 B2
(45) Date of Patent: Sep. 5, 2017

(54) FEEDER AUTOMATIC DISTRIBUTION CONTROL DEVICE AND FEEDER AUTOMATIC DISTRIBUTION CONTROL METHOD

(71) Applicant: FUJI MACHINE MFG. CO., LTD., Chiryu (JP)

(72) Inventors: Seiichi Teraoka, Kariya (JP); Jun Iisaka, Nisshin (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/903,170

(22) PCT Filed: Jul. 12, 2013

(86) PCT No.: PCT/JP2013/069128
§ 371 (c)(1),
(2) Date: Jan. 6, 2016

(87) PCT Pub. No.: WO2015/004797
PCT Pub. Date: Jan. 15, 2015

(65) Prior Publication Data
US 2016/0192546 A1 Jun. 30, 2016

(51) Int. Cl.
*G06F 7/00* (2006.01)
*B23P 19/04* (2006.01)
(Continued)

(52) U.S. Cl.
CPC ... *H05K 13/0417* (2013.01); *G05B 19/41865* (2013.01); *H05K 13/021* (2013.01);
(Continued)

(58) Field of Classification Search
None
See application file for complete search history.

(56) References Cited

U.S. PATENT DOCUMENTS 4,858,308 A * 8/1989 Komori ............. H05K 13/0404
29/33 J
6,230,393 B1 * 5/2001 Hirano ................... H05K 13/04
29/406

(Continued)

FOREIGN PATENT DOCUMENTS

JP   5-111833 A   5/1993
JP   5-186004 A   7/1993
(Continued)

OTHER PUBLICATIONS

International Search Report Issued Oct. 8, 2013 in PCT/JP2013/069128 Filed Jul. 12, 2013.

*Primary Examiner* — Yolanda Cumbess
(74) *Attorney, Agent, or Firm* — Oblon, McClelland, Maier & Neustadt, L.L.P.

(57) ABSTRACT

A feeder automatic distribution control device includes a feeder replenishment section that sequentially replenishes feeders for replenishment, which mounting modules are to be replenished with, a feeder recovery section that sequentially recovers feeders for recovery, which are to be recovered from the mounting modules, a transport lane that transports the feeders for replenishment and the feeders for recovery between each of the feeder replenishment section, the feeder recovery section and the mounting modules, and a control section that controls replenishment and recovery of the feeders for replenishment and the feeders for recovery that are transported in the transport lane, and the control section performs control so that the replenishment of the feeders for replenishment and the recovery of the feeders for recovery are concurrently performed in a sequential manner from mounting modules that are on either an upstream side or a downstream side of the component mounting line.

9 Claims, 8 Drawing Sheets

(51) Int. Cl.
*H05K 13/04* (2006.01)
*H05K 13/08* (2006.01)
*H05K 13/02* (2006.01)
*G05B 19/418* (2006.01)

(52) U.S. Cl.
CPC ......... *H05K 13/0452* (2013.01); *H05K 13/08* (2013.01); *G05B 2219/50386* (2013.01)

(56) References Cited

U.S. PATENT DOCUMENTS

| | | | |
|---|---|---|---|
| 2006/0052893 A1* | 3/2006 | Yamazaki | H05K 13/08 700/100 |
| 2010/0011569 A1* | 1/2010 | Dietrich | H01L 21/67121 29/740 |
| 2011/0269378 A1* | 11/2011 | Boo | B24B 37/345 451/28 |

FOREIGN PATENT DOCUMENTS

| | | |
|---|---|---|
| JP | 7-196164 A | 8/1995 |
| JP | 2898409 B2 | 6/1999 |
| JP | 2011-16619 A | 1/2011 |

* cited by examiner

FEEDER AUTOMATIC DISTRIBUTION CONTROL DEVICE AND FEEDER AUTOMATIC DISTRIBUTION CONTROL METHOD

TECHNICAL FIELD

The present disclosure relates to a feeder automatic distribution control device and a control method that can automatically distribute feeders, in which components are accommodated, to a plurality of mounting modules.

BACKGROUND ART

In a component mounting line, which is formed from a plurality of mounting modules, it is possible to automatically distribute feeders to each mounting module by arranging a transport lane along the plurality of mounting modules, and transporting feeders that include components using the transport lane. A component mounting line disclosed in PTL 1 is known as such a component mounting line.

CITATION LIST

Patent Literature

PTL 1: Japanese Patent No. 2898409

BRIEF SUMMARY

Problem to be Solved

Although transport of a replenishing feeder, and a feeder, which is recovered by a mounting module using the same transport lane is effective in miniaturization of devices and cost reduction, if a feeder for replenishment, and a feeder for recovery are transported using the same transport lane, there are cases in which a plurality of feeders for recovery are moved on the transport lane simultaneously, cases in which a feeder for replenishment and a feeder for recovery are conveyed simultaneously and the like, and not being able to control the transport of feeders for replenishment and feeders for recovery well can lead to delays in the replenishment timing of the mounting modules with components as a result of a deterioration in the replenishment and recovery efficiency of feeders due to the feeders being disordered.

The present disclosure was devised in order to solve the abovementioned technical problems of the related art, and an object thereof is to provide a feeder automatic distribution control device and a control method that can automatically distribute feeders for replenishment to each of a plurality of mounting modules efficiently and at low cost.

Means for Solving the Problem

In order to solve the abovementioned technical problems, the characterizing feature of the disclosure according to an aspect is a feeder automatic distribution control device in a component mounting line, in which a plurality of mounting modules that include mounting heads are disposed along a transport direction of a circuit board, the feeder automatic distribution control device including a feeder replenishment section that sequentially replenishes feeders for replenishment, which the mounting modules should be replenished with, a feeder recovery section that sequentially recovers feeders for recovery, which should be recovered from the mounting modules, a transport lane that transports the feeders for replenishment and the feeders for recovery between each of the feeder replenishment section, the feeder recovery section and the mounting modules, and a replenishment and recovery control section that controls replenishment and recovery of the feeders for replenishment and the feeders for recovery that are transported in the transport lane, in which the replenishment and recovery control section performs control so that the replenishment of the feeders for replenishment and the recovery of the feeders for recovery are concurrently performed in a sequential manner from mounting modules that are on either an upstream side or a downstream side of the component mounting line.

According to an aspect of the disclosure, since the replenishment of the feeders for replenishment and the recovery of the feeders for recovery are concurrently performed in a regular manner from mounting modules that are on either an upstream side or a downstream side of the component mounting line, it is possible to effectively perform transport without the feeders for replenishment and the feeders for recovery crossing one another if the feeders for replenishment and the feeders for recovery are transported concurrently using the same transport lane. As a result of this, it is possible to realize a feeder automatic distribution control device that is capable of efficiently and automatically performing the replenishment of feeders for replenishment and the recovery of feeders for recovery and therefore, it is possible to contribute to a saving in manpower.

According to another aspect of the disclosure, the transport lane is formed from a conveyor that is arranged along the plurality of mounting modules, it is determined whether or not a transported feeder for replenishment is for a self-process in a case in which a feeder for replenishment is transported to a certain mounting module by the conveyor, the feeder for replenishment is carried into the mounting module in a case in which the feeder is for a self-process, and the feeder for replenishment is transported to a later process in a case in which the feeder is not for a self-process.

According to an aspect of the disclosure, it is possible to accurately carry feeders for replenishment, which are to be transported to the plurality of mounting modules, into a mounting module in which the replenishment of a component is required on the basis of information of an identification code that is applied to a feeder, for example.

According to another aspect of the disclosure, the replenishment of the feeders for replenishment and the recovery of the feeders for recovery are initiated with a replenishment preparation completion signal, which indicates that preparation of a feeder for replenishment is complete, as a trigger thereof, and each mounting module carries a feeder for replenishment in after carrying a feeder for recovery out.

According to an aspect of the disclosure, since it is possible to initiate the replenishment of the feeders for replenishment or the recovery of the feeders for recovery with the replenishment preparation completion signal as a trigger thereof, it is possible to continuously control the replenishment of the feeders for replenishment or the recovery of the feeders for recovery. In addition, it is possible to carry a feeder for replenishment in after carrying a feeder for recovery out from each mounting module, and therefore, it is possible to carry a feeder for replenishment in to a mounting site of a component supply position to which a feeder for recovery is carried out.

According to another aspect of the disclosure, the replenishment of the feeders for replenishment and the recovery of the feeders for recovery are initiated with a replenishment preparation completion signal, which indicates that preparation of a feeder for replenishment is complete, as a trigger thereof, and each mounting module carries a feeder for recovery out after carrying a feeder for replenishment in.

According to an aspect of the disclosure, since it is possible to initiate the replenishment of the feeders for replenishment or the recovery of the feeders for recovery with the replenishment preparation completion signal as a trigger thereof, it is possible to continuously control the replenishment of the feeders for replenishment or the recovery of the feeders for recovery. In addition, it is possible to carry a feeder for replenishment in after carrying a feeder for recovery out from each mounting module, and therefore, it is possible to carry a feeder for recovery out after carrying a feeder for replenishment to each mounting module.

According to another aspect of the disclosure, the replenishment and recovery control section includes a priority processing section that continuously performs replenishment of the mounting modules with a prioritized feeder for replenishment, and recovery of the feeders for recovery from the corresponding mounting modules for mounting modules in which the replenishment of a component is required urgently by interchanging a sequence of feeders for replenishment, which are to be used in replenishment, and transporting a prioritized feeder for replenishment, in which an urgent component is accommodated, using the transport lane.

According to an aspect of the disclosure, since it is possible to replenish mounting modules in which the replenishment of a component is required urgently, with a prioritized feeder for replenishment, it is possible to suppress delays of the mounting modules as a result of running out of components.

According to another aspect of the disclosure, a plurality of mounting modules that include mounting heads are disposed along a transport direction of a circuit board, the feeder automatic distribution control method including steps of concurrently recovering a feeder for recovery from a mounting module, and replenishing a mounting module among the mounting modules that is one mounting module on an upstream side, with a feeder for replenishment, and subsequently, concurrently recovering a feeder for recovery from a mounting module, which is adjacent to the above-mentioned mounting module from which the feeder for recovery was recovered, and replenishing a mounting module among the mounting modules, which is one mounting module on an upstream side, with a feeder for replenishment.

According to an aspect of the disclosure, since it is possible to perform the replenishment of the feeders for replenishment and the recovery of the feeders for recovery concurrently in a regular manner from mounting modules that are on either an upstream side or a downstream side of the component mounting line, it is possible to effectively perform transport without the feeders for replenishment and the feeders for recovery crossing one another if the feeders for replenishment and the feeders for recovery are transported concurrently using the same transport lane. As a result of this, it is possible to obtain a feeder automatic distribution control method that is capable of efficiently and automatically performing the replenishment of feeders for replenishment and the recovery of feeders for recovery.

According to another aspect of the disclosure, firstly, a feeder for recovery is recovered from a mounting module that is disposed furthest on an upstream side of the component mounting line, and subsequently, the replenishment of the mounting module from which the feeder for recovery was recovered, with a feeder for replenishment, and the recovery of a feeder for recovery from a mounting module among the mounting modules, which is one mounting module on a downstream side, are performed concurrently.

According to an aspect of the disclosure, since a feeder for recovery is recovered from a mounting module that is disposed furthest on an upstream side of the component mounting line, it is possible to efficiently and automatically perform the replenishment of feeders for replenishment and the recovery of feeders for recovery.

According to another aspect of the disclosure, the method is configured so that, firstly, a mounting module that is disposed furthest on a downstream side of the component mounting line is replenished with a feeder for replenishment, and subsequently, the recovery of a feeder for recovery from the mounting module which was replenished with a feeder for replenishment, and the replenishment of a mounting module among the mounting modules, which is one mounting module on an upstream side, with a feeder for replenishment, are performed concurrently.

According to an aspect of the disclosure, since a feeder for recovery is recovered from a mounting module that is disposed furthest on a downstream side of the component mounting line, it is possible to efficiently and automatically perform the replenishment of feeders for replenishment and the recovery of feeders for recovery.

According to another aspect of the disclosure, replenishment of the mounting modules with a prioritized feeder for replenishment, in which an urgent component is accommodated, and recovery of the feeders for recovery from the mounting modules are continuously performed for mounting modules in which the replenishment of a component is required urgently by interchanging a sequence of feeders for replenishment.

According to an aspect of the disclosure, since it is possible to replenish mounting modules in which the replenishment of a component is required urgently, with a prioritized feeder for replenishment, it is possible to suppress delays of the mounting modules as a result of component depletion.

DESCRIPTION OF EMBODIMENTS

Figure 1:
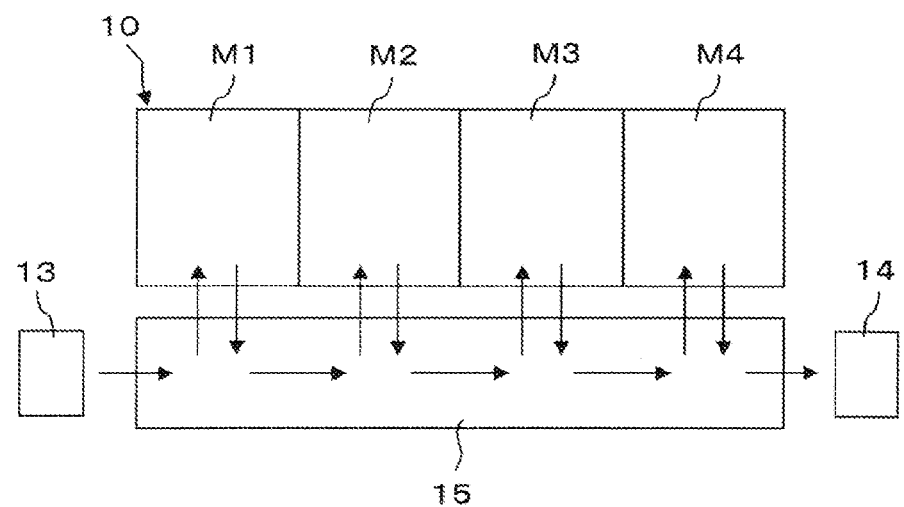
FIG. 1 is a schematic plan view that shows an entire feeder automatic distribution control device according to an embodiment of the present disclosure.

Hereinafter, embodiments of the present disclosure will be described on the basis of the drawings. FIG. 1 is a schematic plan view that shows an entire feeder automatic distribution control device 10 according to an embodiment of the present disclosure, and the corresponding feeder automatic distribution control device 10 is provided with a component mounting line, which is formed from a plurality (four in the embodiment) of mounting modules M1 to M4 that mount electronic components (hereinafter, simply referred to as a component) on circuit boards, a feeder replenishment section 13 for replenishing feeders 11, a feeder recovery section 14 for recovering the feeders 11, and a transport lane 15 that transports the feeders 11 between the feeder replenishment section 13, the feeder recovery section 14 and each mounting module M1 to M4.

Figure 4:
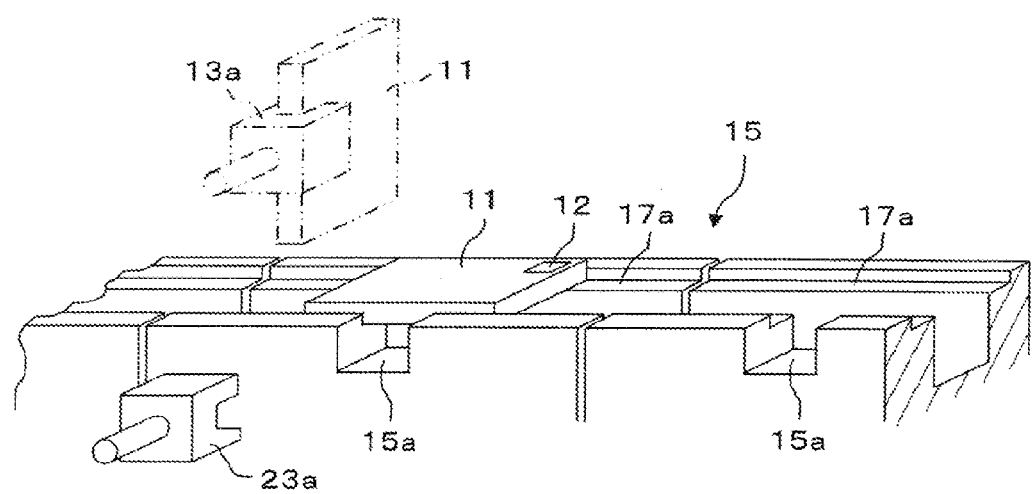
FIG. 4 is a view that shows a hand of a robot that carries feeders in and out between mounting modules and the transport lane.
Figure 5:
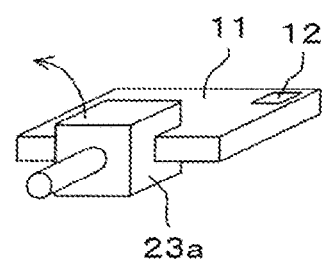
FIG. 5 is a view that shows a gripping state of a feeder by the hand of the robot.

As shown in FIGS. 4 and 5, each feeder 11 is formed from a tape feeder, which has a flat rectangular parallelepiped shape, and in which multiple components that are used in each mounting module M1 to M4, are accommodated. An identification code 12, which is formed from a two-dimensional code that represents a serial ID of a component that is accommodated therein, or the like, is affixed to each feeder 11. The identification code 12 is read by a code reader, which will be described later, and as a result of this, a serial ID of a component that is accommodated in a feeder 11 is read.

Additionally, hereinafter, the discrimination of the feeders 11 will be performed according to necessity, by referring to feeders 11 that mounting modules M1 to M4, in which component replenishment is required, are replenished with, as feeders for replenishment 11A, and referring to feeders that are recovered from the mounting modules M1 to M4, as feeders for recovery 11B.

The transport lane 15 is arranged along the plurality of mounting modules M1 to M4, and is configured by a conveyor 17 (refer to FIG. 2), which transports the feeders 11 in the same direction as a transport direction of circuit boards, in one direction from the mounting module M1 on an upstream side toward the mounting module M4 on a downstream side.

The conveyor 17 of the transport lane 15 is divided into a plurality of conveyors 17a in units of each mounting module M1 to M4, and as shown in FIG. 4, can transport the feeders 11 in a horizontal state (a laid-down state) by driving the conveyors 17a either simultaneously or independently.

Figure 2:
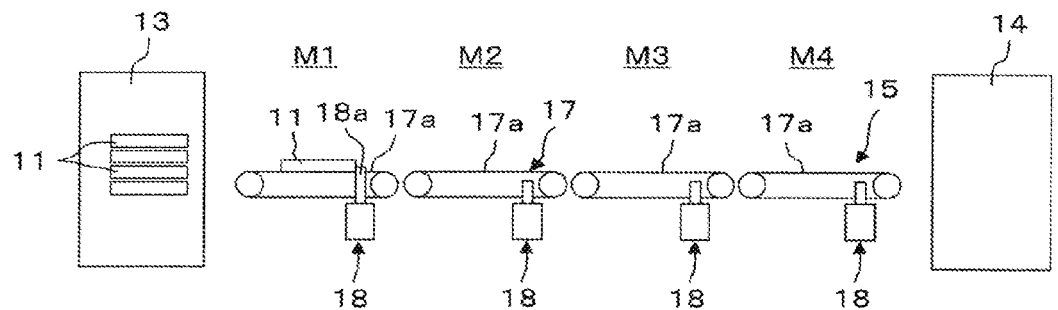
FIG. 2 is a view that shows a configuration of a transport lane.

As shown in FIG. 2, stopper devices 18, which are capable of stopping a feeder for replenishment 11A that is conveyed on a conveyor 17a at positions that correspond to each mounting module M1 to M4, are respectively provided on each conveyor 17a. Each stopper device 18 is provided with a stopper 18a, which is capable of vertical movement, and it is possible to stop feeders for replenishment 11A at positions that correspond to each mounting module M1 to M4 by independently moving the stoppers 18a vertically.

The feeder replenishment section 13 is disposed on the upstream side of the transport lane 15, and the feeder recovery section 14 is disposed on the downstream side of the transport lane 15. The feeder replenishment section 13 is replenished with feeders for replenishment 11A that each mounting module M1 to M4 should be replenished with in accordance with a replenishment sequence according to a component repository 31 (refer to FIG. 6), and the feeders for replenishment 11A are transported to each mounting module M1 to M4 by the transport lane 15. In addition, used feeders for recovery 11B, which are recovered by the feeder recovery section 14, are carried to the component repository 31, and a component is accommodated therein.

Figure 3:
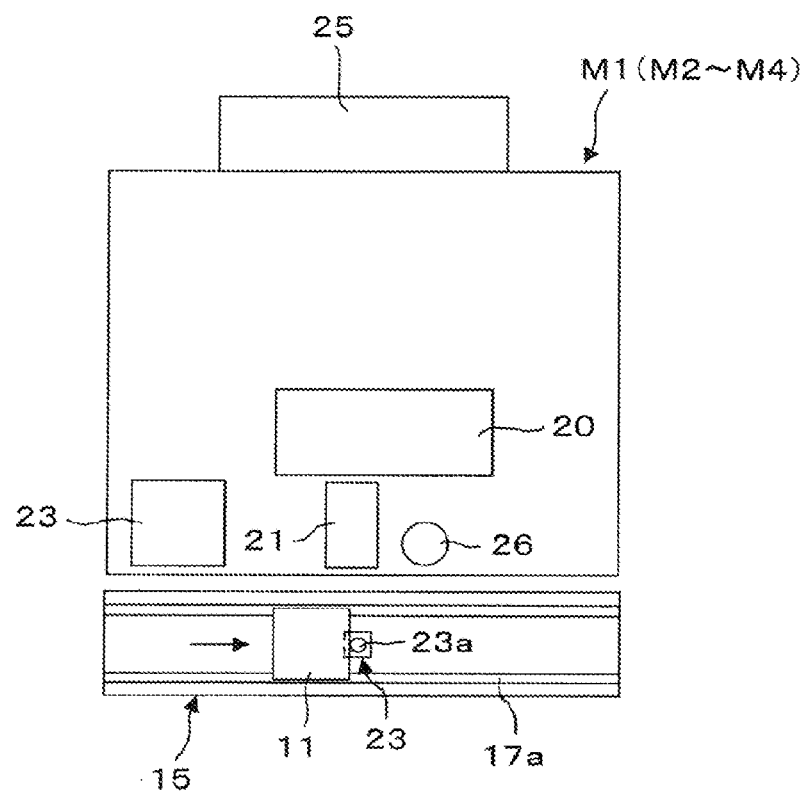
FIG. 3 is a view that shows a configuration of a mounting module.

As shown in FIG. 3, component supply devices 20, which include a plurality of slots (mounting sites) to which a plurality of feeders 11 are detachably mounted, are respectively provided in each mounting module M1 to M4. In addition, buffer areas 21, which temporarily store feeders for replenishment 11A, which the component supply devices 20 are replenished with, and feeders for recovery 11B, which are recovered by the component supply devices 20 in a vertical state (a stood-up state), are provided in each mounting module M1 to M4, and the feeders for replenishment 11A and feeders for recovery 11B are transferred between the buffer areas 21 and the component supply devices 20 by appropriate means, which are not illustrated in the drawings.

A robot 23, which carries the feeders 11 in and out, is respectively provided in each mounting module M1 to M4 between the buffer area 21 and each conveyor 17a of the transport lane 15. As shown in FIGS. 4 and 5, a hand 23a, which grips the feeders 11, is provided in each robot 23, the postures of the feeders 11, which are gripped by the hand 23a, are converted between the horizontal state and the vertical state as a result of turning of the hand 23a, the feeders 11 are carried into each buffer area 21 of the mounting modules M1 to M4, and the feeders 11 are carried out to each conveyor 17a of the transport lane 15.

Additionally, the reference numeral 26 in FIG. 3 shows a code reader 26 that is provided in each mounting module M1 to M4, and the identification codes 12 that are applied to the feeders 11, which are transported to positions that correspond to each mounting module M1 to M4, are read by the code readers 26. In addition, the reference numeral 15a in FIG. 4 shows a hand insertion opening, which is formed in the conveyor 17a, and the feeders 11 in the horizontal state, which are transported by the conveyor 17a, are gripped by the hand 23a, which is inserted from the hand insertion opening 15a.

Figure 6:
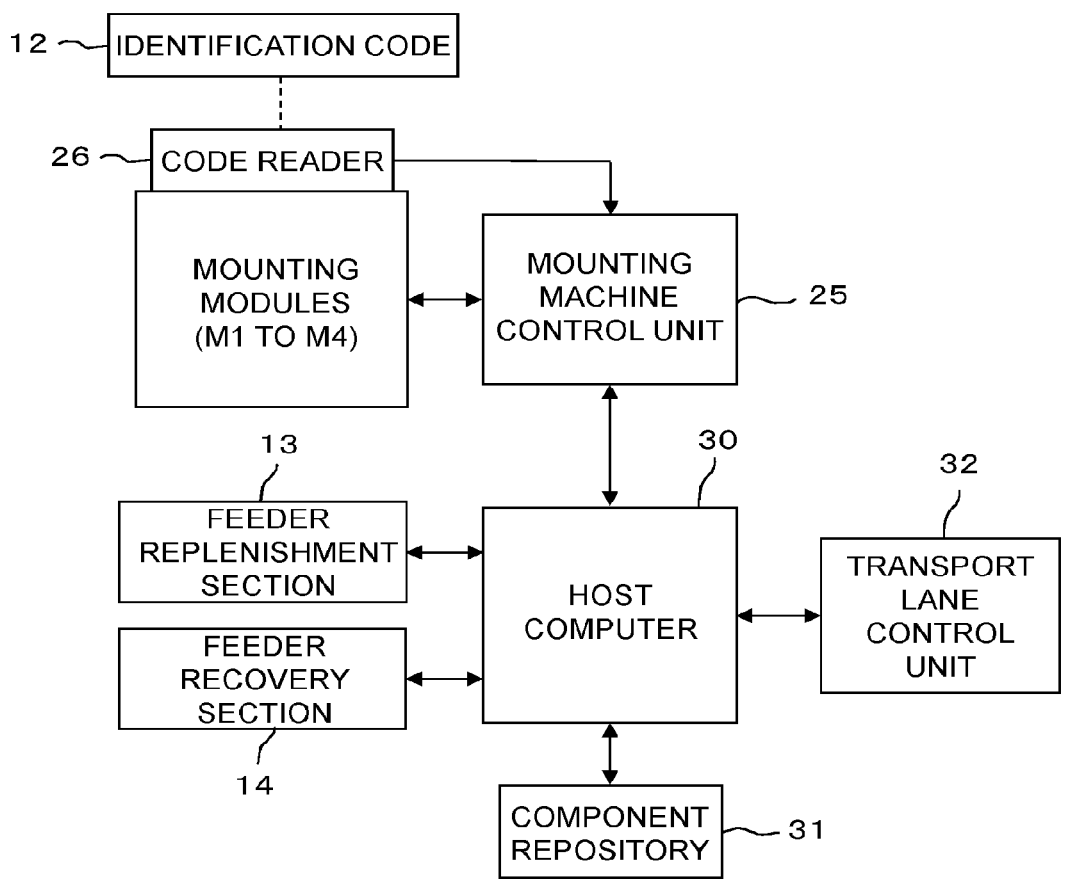
FIG. 6 is a view that shows a control block according to the embodiment.

Mounting machine control units 25, which control each mounting module M1 to M4, are respectively provided in the mounting modules M1 to M4. As shown in FIG. 6, identification code information of a feeder 11, which is read by a code reader 26 is input to the mounting machine control unit 25, and as a result of this, a serial ID of a component is acquired, and it is possible to identify a type or the like of a component that is accommodated in the feeder 11.

The mounting machine control unit 25 is connected to a host computer 30, which controls the feeder replenishment section 13, the feeder recovery section 14 and the component repository 31. A transport lane control unit 32, which controls a conveyor control section that controls each conveyor 17a of the transport lane 15, and a stopper control section that controls the actions of the stoppers 18a of the stopper devices 18, is connected to the host computer 30.

The replenishment of the feeders for replenishment 11A of each mounting module M1 to M4 can, for example, be performed in sequence for each mounting module M1 to M4 every predetermined amount of time, and can perform a recovery action of the feeders for recovery 11B from each mounting module M1 to M4 in tandem with a replenishment action of the feeders for replenishment 11A. The replenishment of the mounting modules M1 to M4 with the feeders for replenishment 11A can be performed depending on irregular component replenishment requests from the mounting modules M1 to M4, which manage a component residual amount of each feeder 11, in accordance with component depletion.

Hereinafter, an example in which the replenishment of the feeders for replenishment 11A and the recovery of the feeders for recovery 11B with respect to each mounting module M1 to M4 are performed regularly and continuously every predetermined amount of time, will be described.

Figure 7:
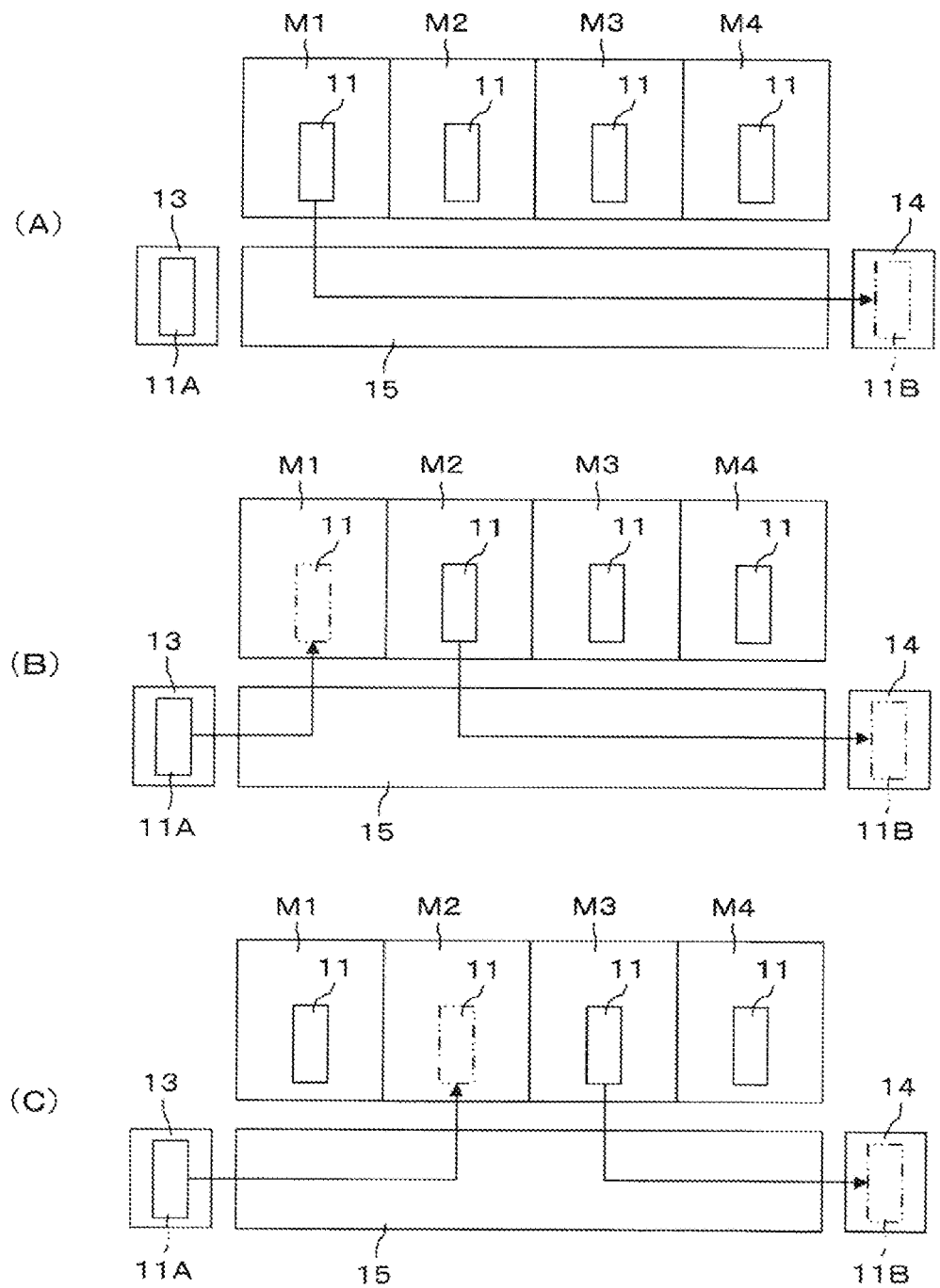
FIG. 7 is an explanatory diagram that shows actions of replenishment and recovery of a feeder according to the embodiment.

FIG. 7 shows an example in which a feeder for recovery 11B is recovered from the mounting module M1, which is on an upstream side (at the front) of the plurality of mounting modules M1 to M4, and a feeder for replenishment 11A is replenished.

Firstly, a feeder for replenishment 11A, which a first mounting module M1 should be replenished with, is prepared in the feeder replenishment section 13, and when a first feeder for replenishment 11A becomes capable of being carried out by the feeder replenishment section 13, a feeder for recovery 11B, which has become unnecessary in the first mounting module M1, is recovered by the feeder recovery section 14 using the transport lane 15 as a result of being transported on the transport lane 15 with the first feeder for replenishment 11A becoming capable of being carried out by the feeder replenishment section 13 as a trigger thereof.

That is, as shown in FIG. 7(A), the feeder for recovery 11B, which has become unnecessary in the first mounting module M1, is migrated to the buffer area 21 by the component supply device 20 of the first mounting module M1. The feeder for recovery 11B, which is migrated to the buffer area 21, is gripped by the hand 23a of the robot 23, and placed on a conveyor 17a of the transport lane 15 in the horizontal state. The feeder for recovery 11B, which is placed on the conveyor 17a, is recovered by the feeder recovery section 14 as a result of being transported to the feeder recovery section 14 due to continuous driving of each conveyor 17a.

When the feeder for recovery 11B, which is carried out from the first mounting module M1 is recovered by the feeder recovery section 14, as shown in FIG. 7(B), the feeder for replenishment 11A, which is prepared in the feeder replenishment section 13, is subsequently put on the transport lane 15, and a feeder for recovery 11B is concurrently carried out from a second mounting module M2 to the transport lane 15 in the same manner as that mentioned above.

The feeder for replenishment 11A, which is input onto the transport lane 15, is stopped by the stopper 18a of the stopper device 18 in a position that corresponds to the first mounting module M1 (the buffer area 21). The identification code 12 of the feeder for replenishment 11A, which is stopped, is read by the code reader 26, and identification of whether or not the feeder for replenishment 11A is a feeder for replenishment 11A for replenishing the first mounting module M1, is performed.

Further, if the feeder for replenishment 11A is identified as a feeder for replenishment 11A for replenishing the first mounting module M1, the feeder for replenishment 11A on the conveyor 17a is gripped by the hand 23a as a result of the robot 23 being controlled. Further, the feeder for replenishment 11A is carried into the buffer area 21 of the first mounting module M1 while the posture thereof is converted from the horizontal state to the vertical state by the robot 23. The feeder for replenishment 11A, which is carried into the buffer area 21, is mounted by appropriate means into an empty slot (mounting site) of the component supply device 20, from which the feeder for recovery 11B was recovered.

Additionally, the timing with which the first mounting module M1 is replenished with the feeder for replenishment 11A may be performed by confirming that the feeder for recovery 11B, which is carried out from the first mounting module M1, is transported to the second mounting module M2 by passing through in front of the first mounting module M1 without waiting until the feeder for recovery 11B is recovered by the feeder recovery section 14.

In this manner, even if the replenishment of the first mounting module M1 with the feeder for replenishment 11A and the recovery of the feeder for recovery 11B from the second mounting module M2 are performed concurrently using the same transport lane 15, as is evident from in FIG. 7(B), since the feeder for replenishment 11A and the feeder for recovery 11B do not cross one another, the replenishment of the feeder for replenishment 11A and the recovery of the feeder for recovery 11B can be performed efficiently, and it is possible to perform the replenishment of the feeder for replenishment 11A and the recovery of the feeder for recovery 11B automatically.

Next, the second mounting module M2 is replenished with a feeder for replenishment 11A from the feeder replenishment section 13 via the transport lane 15 (refer to FIG. 7(C)), and a feeder for recovery 11B is concurrently recovered by the feeder recovery section 14 from a third mounting module M3 via the transport lane 15. At this time, identification of whether or not the feeder for replenishment 11A for replenishing the second mounting module M2 is a feeder for replenishment 11A for replenishing the first mounting module M1, is performed at a position that corresponds to the first mounting module M1 on the basis of the identification code 12, and if the feeder for replenishment 11A is not identified as a feeder for replenishment 11A for replenishing the first mounting module M1, the stopper 18a of the stopper device 18 is lowered, the feeder for replenishment 11A is transported to the next process (the second mounting module M2), and the identification code 12 thereof is identified by the code reader 26 after the feeder for replenishment 11A is stopped by the stopper 18a of the stopper device 18 at a position that corresponds to the second mounting module M2.

Thereafter, the third mounting module M3 is replenished with a feeder for replenishment 11A from the feeder replenishment section 13 via the transport lane 15, and a feeder for recovery 11B is concurrently recovered by the feeder recovery section 14 from a fourth mounting module M4 via the transport lane 15 in the same manner. Lastly, the fourth mounting module M4 is replenished with a feeder for replenishment 11A from the feeder replenishment section 13, and a single cycle of the replenishment of the feeders for replenishment 11A and the recovery of the feeders for recovery 11B with respect to each mounting module M1 to M4 is completed.

Figure 8:
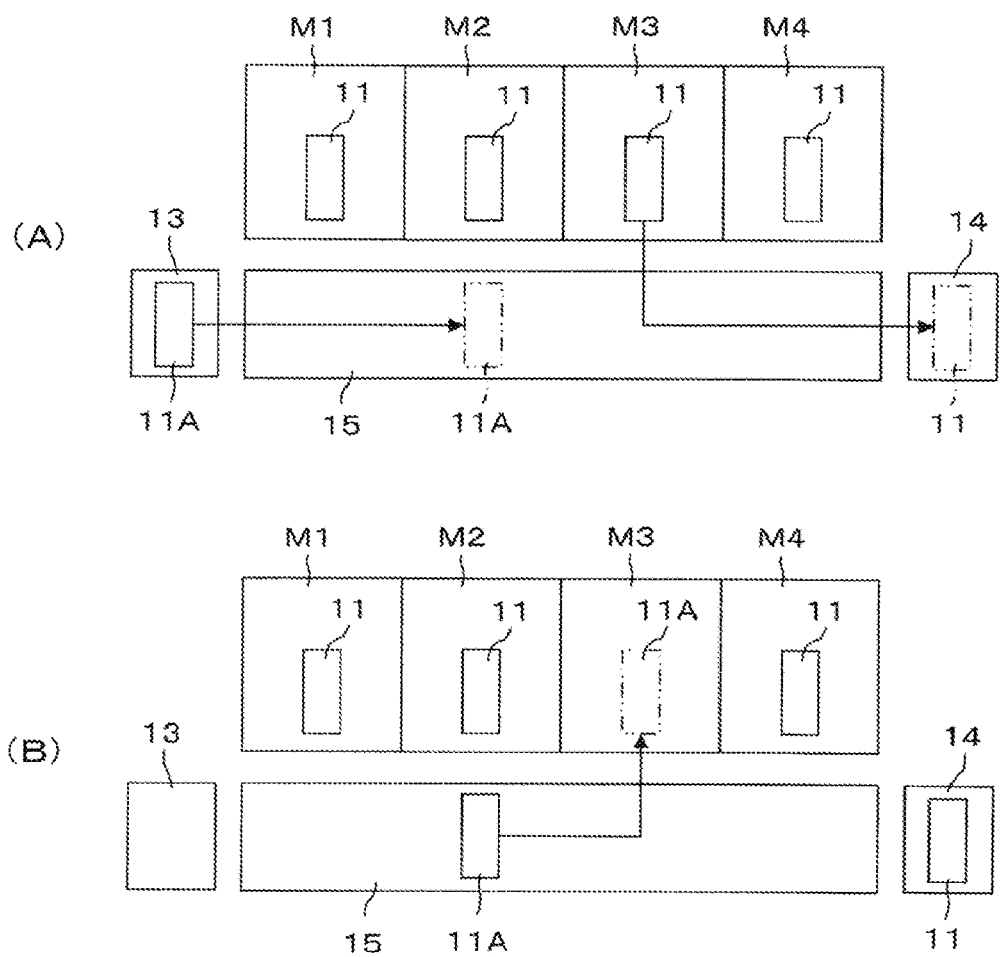
FIG. 8 is an explanatory diagram that shows actions of a prioritization process according to the embodiment.

FIG. 8 shows an example in which a prioritization process of a case in which the replenishment of a component has become urgently required in a specific mounting module when a feeder for recovery 11B is recovered from the upstream side of the mounting modules M1 to M4 and a feeder for replenishment 11A is replenished, is made possible.

In this example, for example, the prioritization process is executed on a preferential basis before the sequence of actions that is mentioned above in a case in which there is a concern that component depletion of feeders 11, in which a certain component is accommodated, will occur in the third mounting module M3, and the replenishment of a feeder 11 in which the same component is accommodated, is desired. In the prioritization process, the feeder for replenishment 11A (hereinafter, referred to as a prioritized feeder for replenishment), the replenishment of which is urgently required, is prepared in the feeder replenishment section, and the sequence of the feeders for replenishment 11A that are input by the feeder replenishment section 13 is interchanged.

As shown in FIG. 8(A), when a prioritized feeder for replenishment 11A becomes capable of being input onto the transport lane 15, a feeder 11, which has run out of components, or a feeder 11, which is recovered in order to secure a location in which to dispose the prioritized feeder for replenishment 11A, is carried out from the third mounting module M3 and placed on a conveyor 17a of the transport lane 15 with the prioritized feeder for replenishment 11A becoming capable of being input onto the transport lane 15 as a trigger thereof. The prioritized feeder for replenishment 11A, which is prepared in the feeder replenishment section 13, is simultaneously input onto the transport lane 15, and as shown in FIG. 8(B), the third mounting module M3 is replenished with the corresponding prioritized feeder for replenishment 11A.

In this manner, in a case of replenishing with a prioritized feeder for replenishment 11A, it is possible to rapidly perform the replenishment of a required component by interchanging the sequence of the feeders for replenishment 11A, which are used in replenishment, and continuously performing the recovery of a feeder for recovery 11B and the replenishment of the prioritized feeder for replenishment 11A with respect to the same mounting module (M3).

In this case, in a case in which component depletion occurs before preparation that can input a prioritized feeder for replenishment 11A onto the transport lane 15 is finalized, it is effective if firstly, the prioritization process is implemented by prioritizing the recovery of a feeder for recovery 11B in which component depletion has occurred, and a required mounting module (M3) is replenished by inputting a prioritized feeder for replenishment 11A onto the transport lane 15 immediately once a stage in which it is possible to input the prioritized feeder for replenishment 11A onto the transport lane 15 is reached.

Figure 9:
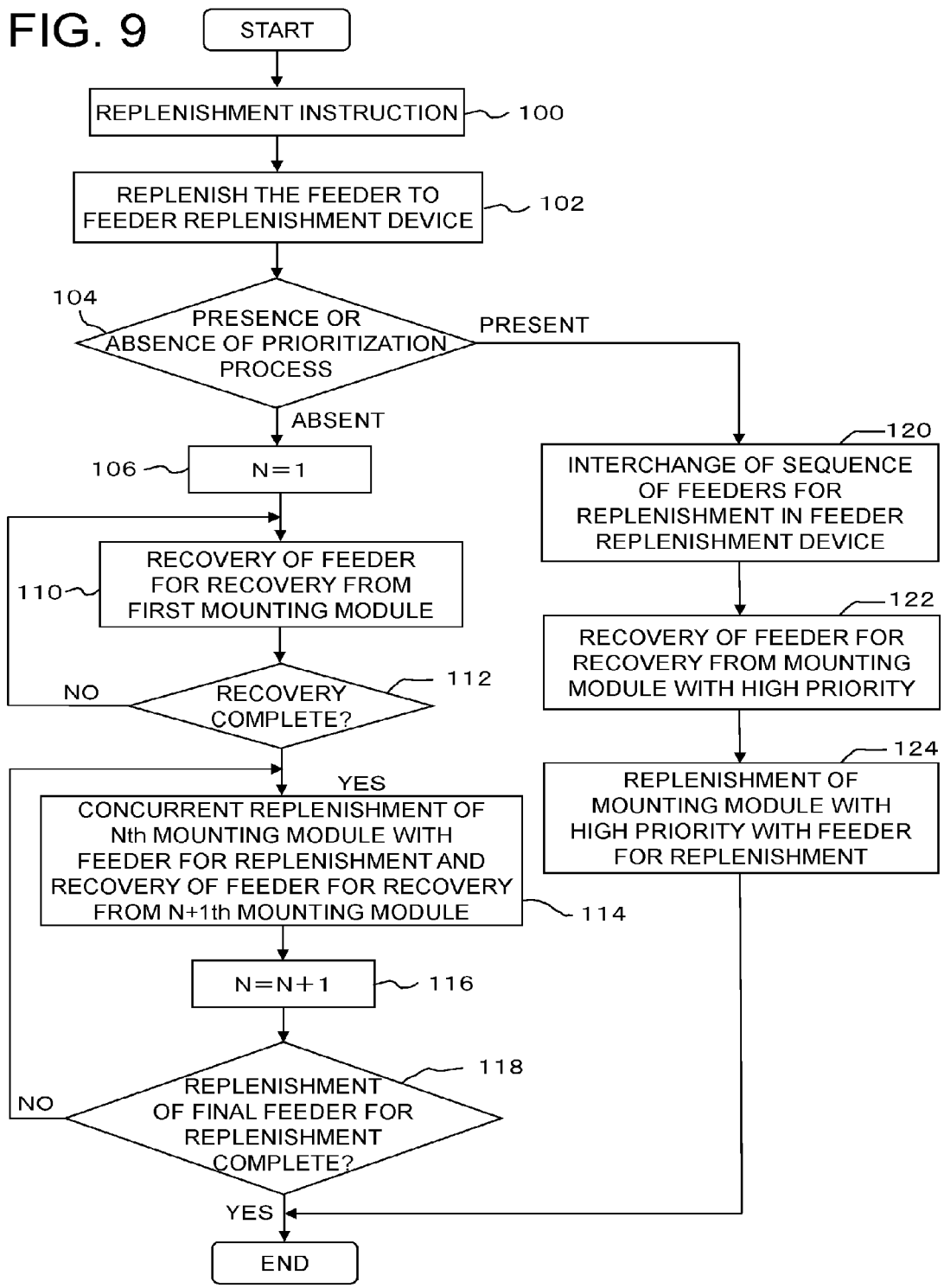
FIG. 9 is a flowchart that shows a control program of feeder automatic distribution according to the embodiment.

Next, a control program that performs the replenishment and the recovery of the feeders for replenishment 11A and the feeders for recovery 11B in the plurality of mounting modules M1 to M4 will be described on the basis of the flowchart of FIG. 9. Additionally, the flowchart that is shown in FIG. 9 shows an example in which each mounting module M1 to M4 is replenished in sequence with the feeders for replenishment 11A every predetermined amount of time at a normal time.

Firstly, in Step 100, a replenishment instruction is generated every predetermined amount of time, and in Step 102, the feeder replenishment section 13 is replenished in sequence with the feeders for replenishment 11A from the component repository 31.

When a first feeder for replenishment 11A becomes capable of being carried out by the feeder replenishment section 13, a feeder for replenishment carry-out potential signal is generated by the host computer 30, and a cycle of the recovery of the feeders for recovery 11B and the replenishment of the feeders for replenishment 11A in the mounting modules M1 to M4 is initiated with the feeder for replenishment carry-out potential signal being generated as a trigger thereof.

That is, in Step 104, the presence or absence of the requirement of a prioritization process, which replenishes a feeder 11 on a preferential basis, is determined in a specific mounting module. In a case in which it is determined that a prioritization process is not required, the process proceeds to Step 106, and a normal process program that recovers a feeder for recovery 11B from the mounting module M1 on the upstream side, and replenishes with a feeder for replenishment 11A, is executed by processes that follow Step 106. Meanwhile, in a case in which it is determined that there is a requirement for a prioritization process, the process proceeds to Step 120, and a prioritization process program that replenishes a specific mounting module with a prioritized feeder for replenishment 11A in a preferential manner, is executed by processes that follow Step 120.

In Step 106, a counter N is set to 1, and subsequently, in Step 110, a feeder for recovery 11B is carried out from an N-th (=1) first mounting module M1, and recovered by the feeder recovery section 14 via the transport lane 15. In Step 112, it is determined whether or not the feeder for recovery 11B, which is carried out from the first mounting module M1, has been recovered, and in a case in which a determination result is YES, in the subsequent Step 114, control is performed so that the first mounting module M1 is replenished with a feeder for replenishment 11A from the feeder replenishment section 13 via the transport lane 15, and a feeder for recovery 11B is carried out from an N+1-th second mounting module M2 in tandem with the replenishment of the first mounting module M1 with the feeder for replenishment 11A.

The tandem control of the replenishment of the feeders for replenishment 11A and the recovery of the feeders for recovery 11B can be performed using communication between each mounting module, or can be performed using the host computer 30.

Next, in Step 116, the counter N moves forward +1, and thereafter, in Step 118, it is determined whether or not the final replenishment of the feeders for replenishment 11A is completed. In a case in which the determination result in the Step is NO, the process returns to Step 114, and instruction is performed so that an N-th (=2) second mounting module M2 is replenished with a feeder for replenishment 11A, and a feeder for recovery 11B is carried out from an adjacent N+1-th third mounting module M3.

In this manner, as a result of the counter N moving forward +1 at a time in Step 116, in Step 118, it is determined whether or not the final replenishment of the feeders for replenishment 11A is completed, and when the determination result becomes YES, one cycle of a program process of the replenishment of the feeders for replenishment 11A and the recovery of the feeders for recovery 11B is completed.

Meanwhile, the process proceeds to Step 120, and in a case in which a prioritization process is executed, in Step 120, a prioritized feeder for replenishment 11A, in which a component for which replenishment is required urgently, is stored, is prepared in the feeder replenishment section 13, and the sequence of the feeders for replenishment 11A is interchanged. Additionally, hereinafter, an example in which the third mounting module M3 is replenished with a prioritized feeder for replenishment 11A, will be described.

In Step 120, the sequence of the feeders for replenishment 11A is interchanged, and when a state in which the carry-out of the prioritized feeder for replenishment 11A by the feeder replenishment section 13 is possible, is attained, in a subsequent Step 122, firstly, a feeder for recovery 11B, in which component depletion has occurred, is recovered by the feeder recovery section 14 via the transport lane 15 as a result of being carried out from the third mounting module M3, in which there is a requirement for replenishment with the prioritized feeder for replenishment 11A. Next, in Step 124, replenishment with the prioritized feeder for replenishment 11A is instructed, and on the basis of this, the prioritized feeder for replenishment 11A is input onto the transport lane 15 from the feeder replenishment section 13, transported to the third mounting module M3 by the transport lane 15, and the third mounting module M3 is replenished.

A replenishment and recovery control section, which replenishes each mounting module M1 to M4 with the feeders for replenishment 11A, is configured by the abovementioned Step 106 to Step 124, a normal process program (a normal processing section), which replenishes with the feeders for replenishment 11A in sequence, is configured by the mounting module M1 on the upstream side (at the front) of each mounting module M1 to M4 by the Step 106 to Step 118, and a prioritization process program (a prioritization process section), which replenishes a specific mounting module with a prioritized feeder for replenishment 11A in a preferential manner, is configured by the abovementioned Step 120 to Step 124.

In this manner, according to the abovementioned embodiment, the feeder automatic distribution control device is configured to firstly recover a feeder for recovery 11B from the mounting module M1, which is disposed furthest on the upstream side of the plurality of mounting modules M1 to M4 via the transport lane 15, and subsequently concurrently replenish the mounting module M1, from which the feeder for recovery 11B is recovered, with a feeder for replenishment 11A via the transport lane 15, and recover a feeder for recovery from the mounting module M2, which is one on the downstream side (at the back) of the corresponding mounting module M1 via the transport lane 15.

As a result of this, since it is even possible to perform transport efficiently without the feeders for replenishment 11A and the feeders for recovery 11B crossing one another when the replenishment and recovery of the feeders for replenishment 11A and the feeders for recovery 11B are performed concurrently using the same transport lane 15, it is possible to perform the replenishment of the feeders for replenishment 11A and the recovery of the feeders for recovery 11B efficiently and automatically, and therefore, it is possible to contribute to a saving in manpower.

In addition, since the replenishment and the recovery of the feeders for replenishment 11A and the feeders for recovery 11B can be performed by a single transport lane 15, it is possible to realize the feeder automatic distribution control device 10 at low cost and save on space.

In addition, according to the abovementioned embodiment, in a case in which the replenishment of a component becomes urgently required in a certain mounting module, since the feeder automatic distribution control device 10 is configured so that the sequence of the feeders for replenishment, with which replenishment is performed, is interchanged, and the recovery of a feeder for recovery 11B from a mounting module in which the replenishment of a component is urgently required, and the replenishment of the mounting module with a prioritized feeder for replenishment 11A, in which an urgent component is accommodated, are continuously performed, there is an effect of it being possible to suppress delays in the mounting modules due to component depletion.

Figure 10:
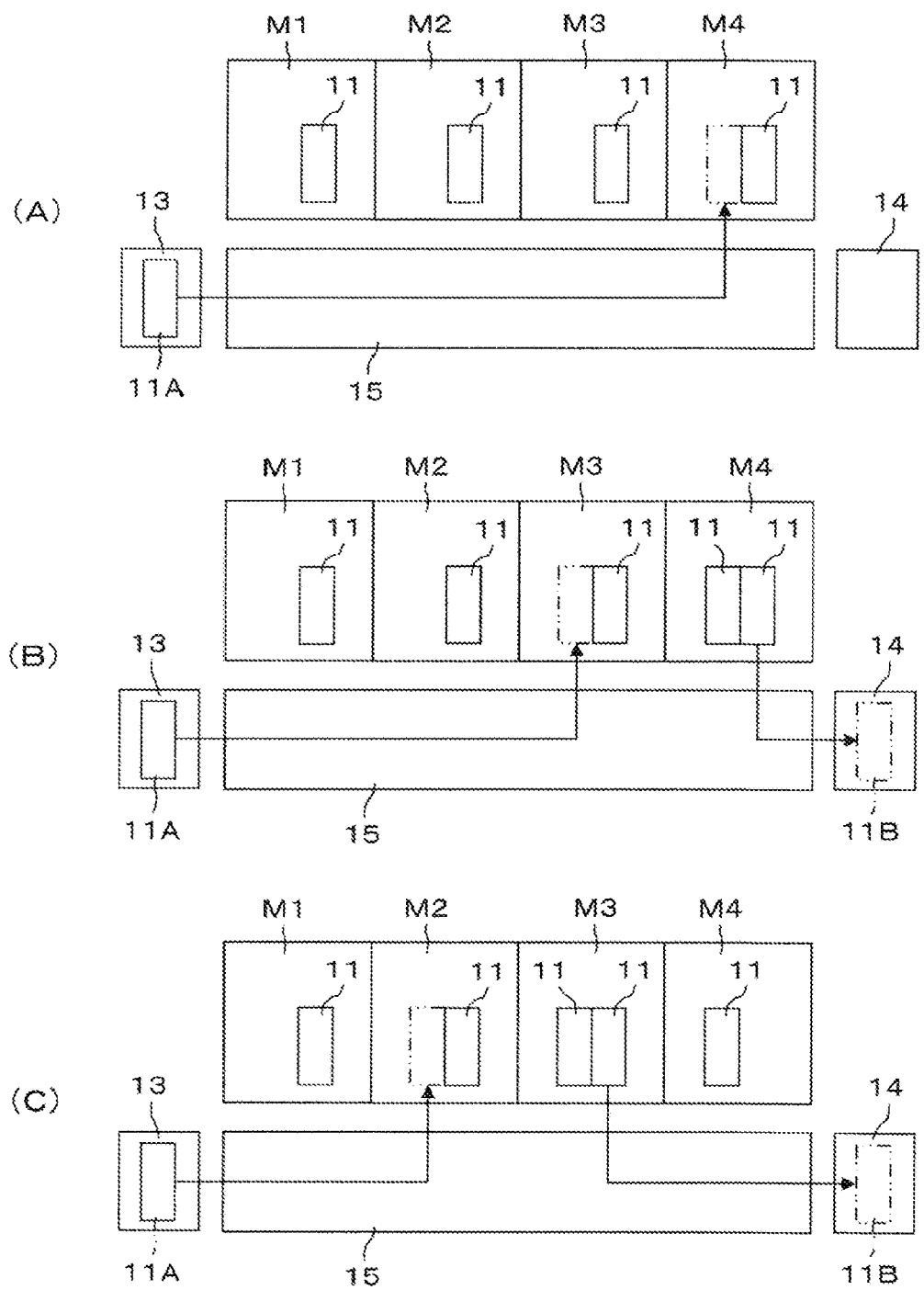
FIG. 10 is an explanatory diagram that shows actions of replenishment and recovery of a feeder according to another embodiment.

FIG. 10 shows another embodiment of the present disclosure, and in contrast to the abovementioned embodiment, shows an example in which the feeders for replenishment 11A are replenished from the mounting module M4 of the downstream side (at the back). Additionally, since the configurations of the mounting modules M1 to M4 and the transport lane 15, and the replenishment of the feeders for replenishment 11A and the recovery action of the feeders for recovery 11B are effectively the same as those of the abovementioned embodiment (refer to FIG. 7), description thereof will be omitted.

In the embodiment that is shown in FIG. 10, firstly, a feeder for replenishment 11A, which the fourth mounting module M4 should be replenished with, is input onto the transport lane 15 from the feeder replenishment section 13, and the fourth mounting module M4 is replenished. Next, a feeder for replenishment 11A, which the third mounting module M3, which is one in front of the fourth mounting module M4, should be replenished with, is input onto the transport lane 15 from the feeder replenishment section 13, and the third mounting module M3 is replenished.

At this time, a feeder for recovery 11B is recovered by the feeder recovery section 14 via the transport lane 15 as a result of being carried out from the fourth mounting module M4, in which the feeder for replenishment 11A is replenished, concurrently with the replenishment of the third mounting module M3 with the feeder for replenishment 11A.

In this example also, in the concurrent action of the replenishment of the third mounting module M3 with the feeder for replenishment 11A and the recovery of the feeder for recovery 11B from the fourth mounting module M4, since the feeders 11 do not cross one another regardless of what happens, it is possible to perform the replenishment of the feeders for replenishment 11A and the recovery of the feeders for recovery 11B efficiently.

However, in the example, since the feeder for replenishment 11A is replenished before the feeder for recovery 11B is recovered from each mounting module M1 to M4, in comparison with the abovementioned embodiment, it is necessary to configure that it is possible to simultaneously store the feeder for replenishment 11A and the feeder for recovery 11B in the component supply device 20 or to provide surplus empty slots in the buffer area 21.

Thereafter, the second mounting module M2 and the first mounting module M1 are sequentially replenished with feeders for replenishment 11A concurrently with the sequential recovery of the feeders for recovery 11B from the third mounting module M3 and the second mounting module M2 in the same manner, and lastly a single cycle is completed by recovering a feeder for recovery 11B from the first mounting module M1.

According to the embodiment, since the feeder automatic distribution control device 10 is configured to firstly replenish the mounting module M4, which is disposed furthest on the downstream side (at the back) of the plurality of mounting modules M1 to M4, with a feeder for replenishment 11A, and subsequently recover a feeder for recovery 11B from the mounting module M4, which was replenished with the feeder for replenishment 11A, concurrently with replenishing the mounting module M3, which is one on the upstream side (in front of) of the corresponding mounting module M4, even if the replenishment and the recovery of the feeders for replenishment 11A and the feeders for recovery 11B are performed concurrently using the same transport lane, it is possible to perform transport efficiently without the feeders for replenishment 11A and the feeders for recovery 11B crossing one another. As a result of this, in the same manner as the embodiment (FIG. 7) that is mentioned above, it is possible to perform the replenishment of the feeders for replenishment 11A and the recovery of the feeders for recovery 11B efficiently and automatically.

In the abovementioned embodiments, an example that performs automatic distribution of feeders 11 through combined use of the normal process program and the prioritization process program, was described, but it is possible to omit the prioritization process program, and in this case, since Step 104 of FIG. 9 is also unnecessary, it is possible to initiate the recovery of the feeders for recovery 11B or the replenishment of the feeders for replenishment 11A immediately with the replenishment preparation completion signal, which indicates that preparation of a feeder for replenishment 11A in the feeder replenishment section 13, as a trigger thereof.

In addition, in the abovementioned embodiments, an example in which the identification codes 12 are affixed on the feeders 11, the identification codes 12 are read by the code readers 26 that are provided in each mounting module M1 to M4, and identification of whether or not the feeders 11 were carried into the mounting modules M1 to M4, is performed, was described, but the same control as the case of reading with the code readers 26 can also be performed in a case in which it is difficult to provide the code reader 26 due to physical (or cost) reasons or the like, using a "backward transmission" technique that also simultaneously feeds the information of the identification code of the feeder for replenishment 11A when the feeder for replenishment 11A is input onto the transport lane 15, and also simultaneously transfers the identification code information backward each time the feeders for replenishment 11A are transported to each mounting module M1 to M4.

In this case, the transfer method of the information of the identification code can be performed using communication between each control unit 25, which controls the mounting modules M1 to M4, or can be performed by providing another unit such as a host computer.

Furthermore, in the abovementioned embodiments, an example in which the buffer area 21 is provided in each mounting module M1 to M4 is described, but it is possible to omit the buffer area 21 by Depending on the configuration of the component supply device 20 and the robot 23 or the like to be used.

Additionally, the configurations of the mounting modules M1 to M4 and the transport lane 15 in the abovementioned embodiments merely show preferred examples for implementation of the present disclosure, and the present disclosure is not limited to the configurations mentioned in the embodiments. In addition, rather than being a device that is applied to all of the mounting modules that configure a component mounting line, the present automatic distribution control device may also be applied to a portion of the mounting modules only.

It should be noted that embodiments are non-limiting and can be embodied in various changed forms based on the knowledge of someone skilled in the art

INDUSTRIAL APPLICABILITY

The feeder automatic distribution control device and feeder automatic distribution control method according to the present disclosure are suitable for use in the replenishment and the recovery of feeders for replenishment and feeders for recovery between a plurality of mounting modules and a transport lane.

REFERENCE SIGNS LIST

10 . . . FEEDER AUTOMATIC DISTRIBUTION CONTROL DEVICE, 11 (11A AND 11B) . . . FEEDER, (FEEDER FOR REPLENISHMENT AND FEEDER FOR RECOVERY), 12 . . . IDENTIFICATION CODE, 13 . . . FEEDER REPLENISHMENT SECTION, 14 . . . FEEDER RECOVERY SECTION, 15 . . . TRANSPORT LANE, 17 (17a) CONVEYOR, 20 . . . COMPONENT SUPPLY DEVICE, 23 . . . ROBOT, 25 . . . MOUNTING MACHINE CONTROL UNIT, 26 . . . CODE READER, 30 . . . HOST COMPUTER, 32 . . . TRANSPORT LANE CONTROL UNIT, M1 TO M4 . . . MOUNTING MODULE, STEPS 106 TO 124 . . . REPLENISHMENT AND RECOVERY CONTROL SECTION, STEPS 120 TO 124 . . . PRIORITIZATION CONTROL SECTION

The invention claimed is:

1. A feeder automatic distribution control device in a component mounting line including a plurality of mounting modules that include mounting heads disposed along a transport direction of a circuit board, the feeder automatic distribution control device comprising:
a feeder replenishment section that sequentially replenishes feeders to the mounting modules;
a feeder recovery section that sequentially recovers the feeders from the mounting modules;
a transport lane that transports the feeders between each of the feeder replenishment section, the feeder recovery section, and the mounting modules; and
a replenishment and recovery control section that controls replenishment and recovery of the feeders that are transported in the transport lane,
wherein the replenishment and recovery control section performs control so that the replenishment of the feeders and the recovery of the feeders are performed concurrently, and
wherein the feeders are transported in a sequential manner from mounting modules that are on either an upstream side or a downstream side of the component mounting line.

2. The feeder automatic distribution control device according to claim 1,
wherein the transport lane is formed from a conveyor that is arranged along the plurality of mounting modules.

3. The feeder automatic distribution control device according to claim 1,
wherein the replenishment of the feeders and the recovery of the feeders are initiated with a replenishment preparation completion signal, which indicates that preparation of a feeder for replenishment is complete, and
wherein a feeder at a mounting module is sent to the feeder recovery section and then the mounting module receives a feeder from the feeder replenishment section.

4. The feeder automatic distribution control device according to claim 1,
wherein the replenishment of the feeders and the recovery of the feeders are initiated with a replenishment preparation completion signal, which indicates that preparation of a feeder for replenishment is complete, and
wherein a feeder from the feeder replenishment section is received at a mounting module and then a feeder at the mounting module is sent to the feeder recovery section.

5. The feeder automatic distribution control device according to claim 1,
wherein the replenishment and recovery control section includes a priority processing section that continuously performs replenishment of the mounting modules with a prioritized feeder when the replenishment of a component in the prioritized feeder is required, and
wherein the prioritized feeder is transported by the transport lane.

6. A feeder automatic distribution control method in a component mounting line including a plurality of mounting modules that include mounting heads disposed along a transport direction of a circuit board, the feeder automatic distribution control method comprising steps of:

concurrently recovering a first feeder from a first mounting module among the mounting modules and replenishing the first mounting module with a second feeder on an upstream side of the first mounting module; and subsequently, concurrently recovering a third feeder from a second mounting module among the mounting modules which is adjacent to the first mounting module and replenishing the second mounting module with a fourth feeder on an upstream side of the second mounting module.

7. The feeder automatic distribution control method according to claim 6,
wherein the first mounting module is disposed farthest on an upstream side of the component mounting line, and the second mounting module is one mounting module downstream from the first mounting module.

8. The feeder automatic distribution control method according to claim 6,
wherein the first mounting module is disposed farthest on a downstream side of the component mounting, and the second mounting module is one mounting module on an upstream side.

9. The feeder automatic distribution control method according to claim 6, further comprising:
replenishing the mounting modules with a prioritized feeder that contains an urgent component when the replenishment of the urgent component is required.

* * * * *